(12) United States Patent
Venkatraman et al.

(10) Patent No.: US 8,525,709 B2
(45) Date of Patent: Sep. 3, 2013

(54) SYSTEMS AND METHODS FOR DESIGNING ADC BASED ON PROBABILISTIC SWITCHING OF MEMORIES

(75) Inventors: Subramaniam Venkatraman, Santa Clara, CA (US); Jeffrey Alexander Levin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 58 days.

(21) Appl. No.: 13/238,053

(22) Filed: Sep. 21, 2011

(65) Prior Publication Data
US 2013/0069809 A1 Mar. 21, 2013

(51) Int. Cl.
*H03M 1/56* (2006.01)
*H03M 1/04* (2006.01)

(52) U.S. Cl.
CPC .. *H03M 1/04* (2013.01); *H03M 1/56* (2013.01)
USPC .......................................... 341/109; 341/155

(58) Field of Classification Search
USPC .................. 341/109, 155; 365/158
See application file for complete search history.

(56) References Cited

U.S. PATENT DOCUMENTS

| 6,314,020 | B1 | 11/2001 | Hansen et al. |
| 6,362,766 | B1 | 3/2002 | Rowan et al. |
| 6,476,753 | B1 | 11/2002 | Hansen et al. |
| 6,545,906 | B1 * | 4/2003 | Savtchenko et al. .......... 365/158 |
| 6,677,877 | B2 | 1/2004 | Johnson et al. |
| 7,239,541 | B2 * | 7/2007 | Saito et al. ..................... 365/158 |
| 7,355,882 | B2 * | 4/2008 | Boeve ............................ 365/158 |
| 2007/0223269 | A1 * | 9/2007 | Saito et al. ..................... 365/158 |
| 2010/0220523 | A1 | 9/2010 | Modha et al. |
| 2012/0313801 | A1 * | 12/2012 | Maejima et al. ............... 341/155 |

FOREIGN PATENT DOCUMENTS

| GB | 2144287 A | 2/1985 |
| WO | 2011086378 A1 | 7/2011 |

OTHER PUBLICATIONS

International Search Report and Written Opinion—PCT/US2012/056718—ISA/EPO—Jan. 21, 2012.
Weaver, S et al., "Stochastic Flash Analog-to-Digital Conversion", IEEE Transactions on Circuits and Systems I: Regular Papers, IEEE, US, vol. 57, No. 11, Nov. 1, 2010, pp. 2825-2833. XP011311896, ISSN: 1549-8328.

* cited by examiner

*Primary Examiner* — Howard Williams
(74) *Attorney, Agent, or Firm* — Rupit M. Patel

(57) ABSTRACT

Certain aspects of the present disclosure provide a probabilistic analog to digital converter (ADC). The probabilistic ADC may be configured to convert an analog input to a variable-length or variable-amplitude pulse, apply the pulse to a plurality of memory elements as a switching pulse, and determine a digital value based on a number of memory elements that store a value after the switching pulse is applied.

24 Claims, 6 Drawing Sheets

$t_{pulse} = Const + a \cdot V_{input}$

US 8,525,709 B2

SYSTEMS AND METHODS FOR DESIGNING ADC BASED ON PROBABILISTIC SWITCHING OF MEMORIES

FIELD

Certain embodiments of the present disclosure generally relate to analog to digital converters and, more particularly, to designing a probabilistic analog to digital converter.

BACKGROUND

An analog-to-digital converter (ADC) is a device that converts a continuous quantity to a discrete time digital representation. Current analog to digital converters can achieve high sampling rate and high linearity, but are typically based on analog circuits which may have large area. Currently, size of the ADCs do not shrink appreciably with technology node due to reliance on analog circuits.

SUMMARY

Certain embodiments of the present disclosure provide a method for analog to digital conversion. The method generally includes converting an analog input to a variable pulse, applying the variable pulse to a plurality of binary memory elements as a switching pulse, wherein the plurality of memory elements are initialized with a first value, and determining a digital value based on a number of memory elements that store a second value after the switching pulse is applied.

Certain embodiments of the present disclosure provide an apparatus for analog to digital conversion. The apparatus generally includes means for converting an analog input to a variable pulse, means for applying the variable pulse to a plurality of memory elements as a switching pulse, wherein the plurality of memory elements are initialized with a first value, and means for determining a digital value based on a number of memory elements that store a second value after the switching pulse is applied.

Certain embodiments of the present disclosure provide an apparatus for analog to digital conversion. The apparatus generally includes at least one processor configured to convert an analog input to a variable pulse, apply the variable pulse to a plurality of memory elements as a switching pulse, wherein the plurality of memory elements are initialized with a first value, and determine a digital value based on a number of memory elements that store a second value after the switching pulse is applied; and a memory coupled with the at least one processor.

Certain embodiments of the present disclosure provide a computer program product comprising a computer-readable medium having instructions stored thereon. The instructions are generally executable by one or more processors for converting an analog input to a variable pulse, applying the variable pulse to a plurality of memory elements as a switching pulse, wherein the plurality of memory elements are initialized with a first value, and determining a digital value based on a number of memory elements that store a second value after the switching pulse is applied.

BRIEF DESCRIPTION OF THE DRAWINGS

So that the manner in which the above-recited features of the present disclosure can be understood in detail, a more particular description, briefly summarized above, may be had by reference to embodiments, some of which are illustrated in the appended drawings. It is to be noted, however, that the appended drawings illustrate only certain typical embodiments of this disclosure and are therefore not to be considered limiting of its scope, for the description may admit to other equally effective embodiments.

DETAILED DESCRIPTION

Various embodiments of the disclosure are described more fully hereinafter with reference to the accompanying drawings. This disclosure may, however, be embodied in many different forms and should not be construed as limited to any specific structure or function presented throughout this disclosure. Rather, these embodiments are provided so that this disclosure will be thorough and complete, and will fully convey the scope of the disclosure to those skilled in the art. Based on the teachings herein one skilled in the art should appreciate that the scope of the disclosure is intended to cover any embodiment of the disclosure disclosed herein, whether implemented independently of or combined with any other embodiment of the disclosure. For example, an apparatus may be implemented or a method may be practiced using any number of the embodiments set forth herein. In addition, the scope of the disclosure is intended to cover such an apparatus or method which is practiced using other structure, functionality, or structure and functionality in addition to or other than the various embodiments of the disclosure set forth herein. It should be understood that any embodiment of the disclosure disclosed herein may be embodied by one or more elements of a claim.

The word "exemplary" is used herein to mean "serving as an example, instance, or illustration." Any embodiment described herein as "exemplary" is not necessarily to be construed as preferred or advantageous over other embodiments.

Although particular embodiments are described herein, many variations and permutations of these embodiments fall within the scope of the disclosure. Although some benefits and advantages of the preferred embodiments are mentioned, the scope of the disclosure is not intended to be limited to particular benefits, uses or objectives. Rather, embodiments of the disclosure are intended to be broadly applicable to different technologies, system configurations, networks and protocols, some of which are illustrated by way of example in the figures and in the following description of the preferred embodiments. The detailed description and drawings are merely illustrative of the disclosure rather than limiting, the scope of the disclosure being defined by the appended claims and equivalents thereof.

An Example Analog to Digital Converter

Figure 1:
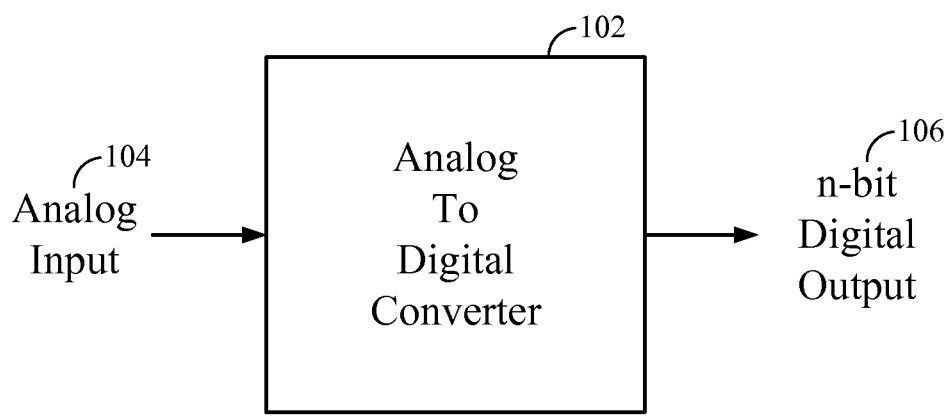
FIG. 1 illustrates an example analog to digital converter (ADC), in accordance with certain aspects of the present disclosure.

FIG. 1 illustrates an example analog to digital converter (ADC), in accordance with certain aspects of the present disclosure. The ADC 102 converts a continuous quantity (e.g., analog input 104) to a discrete time digital representation (e.g., digital output 106). The analog input 104 may be an analog voltage or current, and the digital output 106 may be a digital number proportional to the magnitude of the input voltage or current. The digital output may be a binary number represented by n bits, in which n may be an integer number.

Most ADC designs require analog building blocks, which may not scale with process technology. Certain aspects of the present disclosure present design of a probabilistic ADC, which exploits probabilistic switching behavior of nano-scale memory elements to digitize an analog signal. The proposed probabilistic ADC utilizes digital building blocks, which may scale with advancements in process technology.

Some emerging memory technologies such as spin-transfer torque (STT) random access memories (RAMs) possess a unique probabilistic switching property, in which switching probability of the memory is a function of write current and pulse width. In this disclosure, the probabilistic switching behavior of memory elements is exploited to design low-area ADCs. It should be noted that the description that follows focuses on the STT RAMs. However, the proposed probabilistic ADCs may be designed using any probabilistic memory elements (e.g., probabilistic nano-scale memory elements), all of which fall within the scope of this disclosure.

Figure 2:
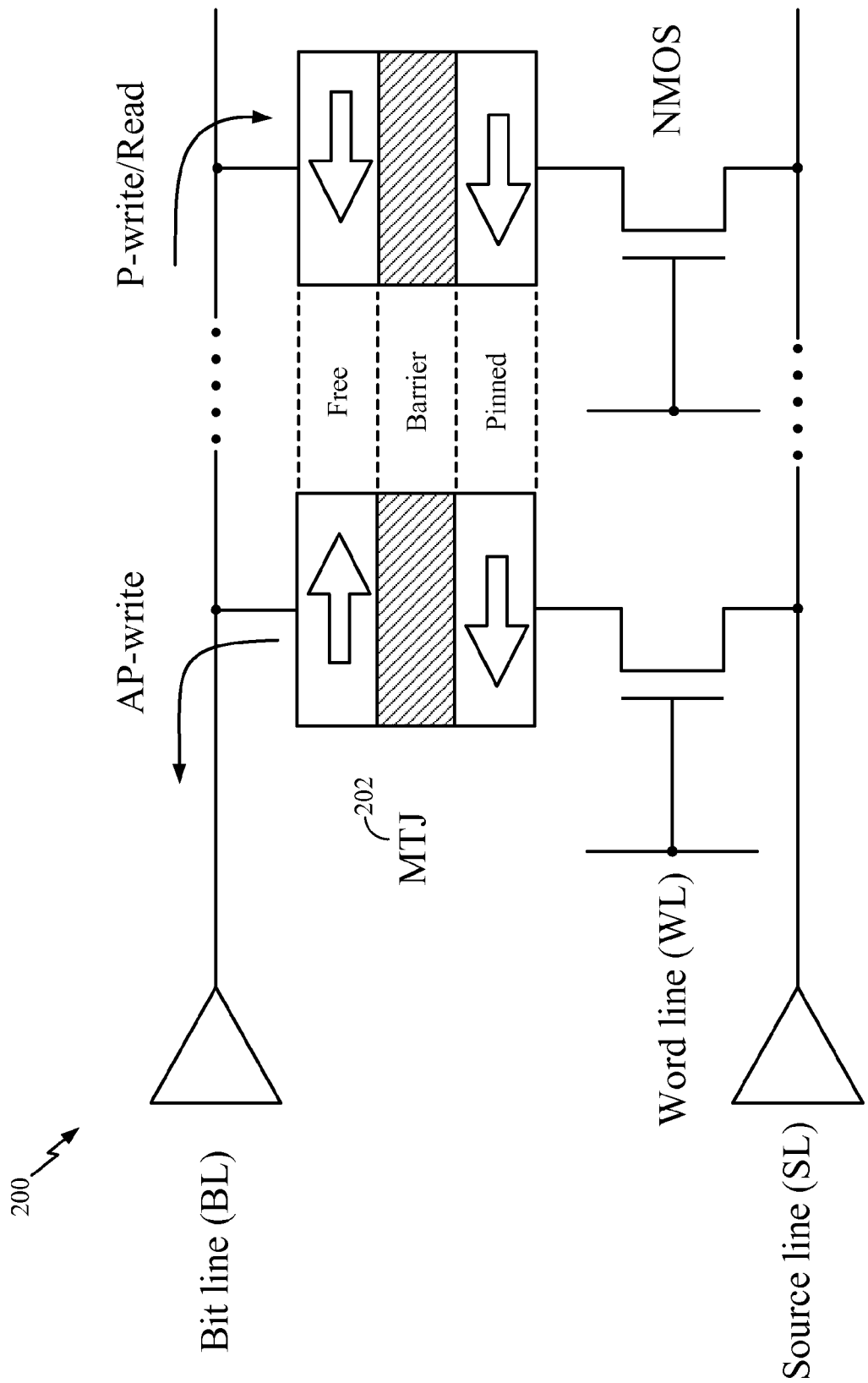
FIG. 2 illustrates a spin transfer torque (STT) random access memory (RAM).

An STT RAM is a memory technology in which an electric current may be polarized by aligning spin of electrons that are flowing through a magnetic tunnel junction (MTJ) element, as illustrated in FIG. 2. The MTJ element 202 may have two magnetic layers and a tunnel barrier layer between the two magnetic layers. One of the magnetic layers may be a switching layer, and the other magnetic layer may be pinned in its magnetization direction.

Data may be written into the STT RAM utilizing a spin-polarized current to change magnetic orientation of the switching layer in the MTJ element. The resultant resistance difference of the MTJ element may be used to read out the information from the memory.

Figure 3:
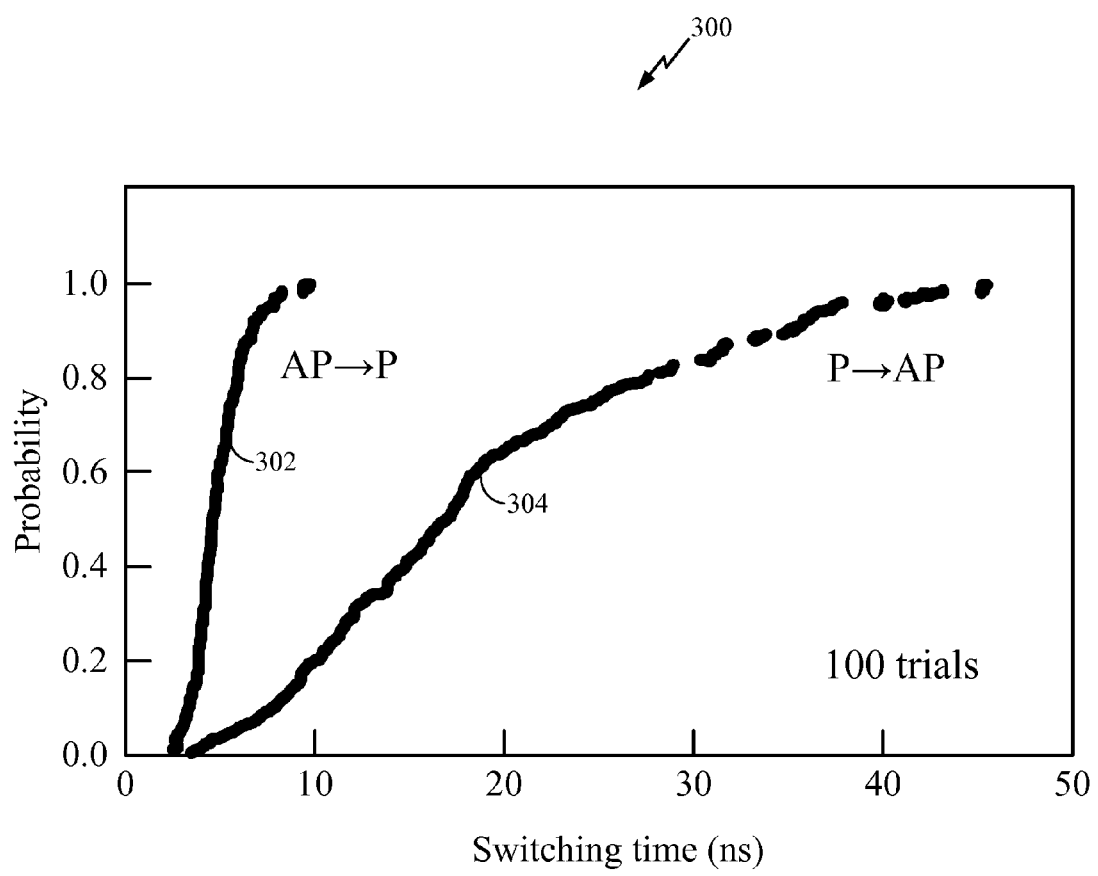
FIG. 3 illustrates switching probability of an STT RAM as a function of width of a current pulse.

FIG. 3 illustrates switching probability of an STT RAM 200 as a function of width of a current pulse. As illustrated, the longer the width of the current pulse, the higher the probability of switching of the STT RAM. Curve 302 shows switching from Anti-Parallel (AP) to Parallel (P) and curve 304 shows switching from P to AP.

Figure 4:
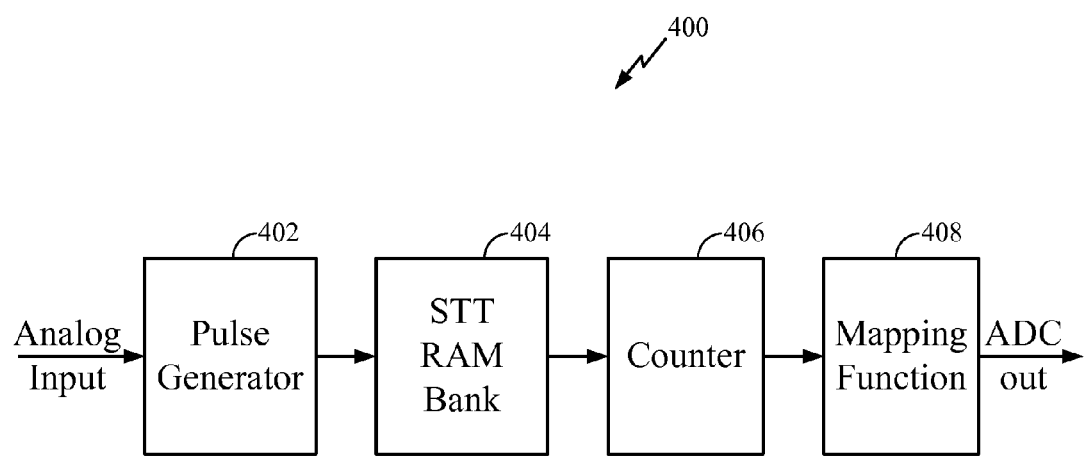
FIG. 4 illustrates an example probabilistic ADC, in accordance with certain aspects of the present disclosure.

FIG. 4 illustrates an example probabilistic ADC 400, in accordance with certain aspects of the present disclosure. The ADC may include a pulse generator 402, an array of STT RAMs (e.g., STT RAM bank 404), a counter 406 and a mapping function 408. The pulse generator 402 may convert an analog input value to a variable-length pulse, in which the length of the pulse ($t_{pulse}$) may be proportional to the analog value ($V_{input}$). The variable-length pulse may be used to switch the array of STT RAMs.

It should be noted that a variable-length pulse is presented here as an example. In general, any variable pulse such as a variable length, variable amplitude or even constant current or constant voltage pulse may be used to control probability of switching of memories in the memory bank (e.g., nano memory bank).

According to certain aspects, memory elements in the STT RAM bank 404 may first be initialized to a predetermined value (e.g., zero) by applying a super-threshold pulse. The variable-length pulse $t_{pulse}$ may then be applied to the STT RAM bank 404 as a switching pulse, which may cause some of the STT RAMs to switch their state. The STT RAM bank 404 may later be read out in parallel. The counter 406 may count number of memory elements that have switched to a different value ($N_{switch}$). For example, if the STT RAMs are initialized with zeros, the counter may count number of 'ones' that are created in the array (e.g., the memory bank). The $N_{switch}$ may be proportional to the analog value being sampled. The mapping function 408 maps the number of memory elements in the array whose values have switched (e.g., $N_{switch}$) to a digital output.

For certain aspects, a number of memory elements in the memory bank 404 (e.g., $N_{mem}$) may be greater than or equal to $2^{2n}$ elements (which results in $2^{2n}$ stochastic bits), such that the probabilistic ADC 400 may accurately estimate an n-bit analog value. Therefore, a 6-bit probabilistic ADC may require approximately 4000 memory elements (e.g., STT RAMs).

For certain aspects, a calibration step may be periodically performed to map $N_{switch}$ to analog values. The calibration may be considered as correcting integral non-linearity (INL) of the probabilistic ADC. The INL represents the maximum deviation between the ideal output of an ADC and the actual output level.

Differential non-linearity (DNL) of the proposed probabilistic ADC may be very good since the ADC does not rely on precise matching between analog values and number of switched memory elements. In addition, the number of switched memory elements varies monotonically with the length of the pulse. Differential non-linearity of an ADC refers to the deviation of output of the ADC from ideal (e.g., linear) when its input is linearly swept across its entire range.

Figure 5A:
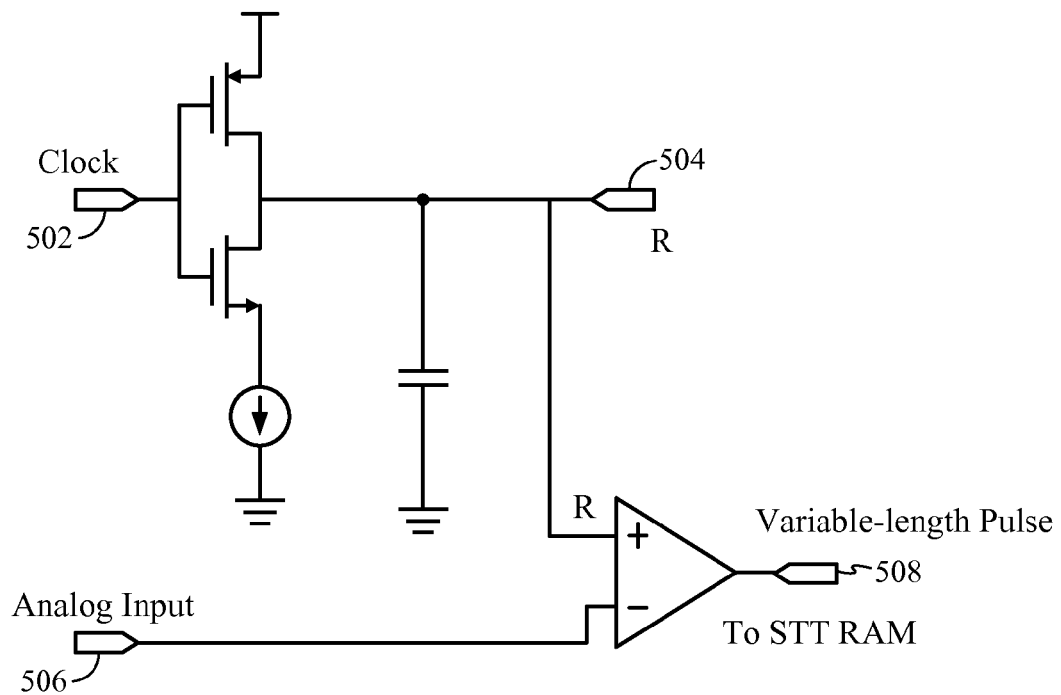
FIG. 5A-5B illustrate an example circuit and its corresponding input and output waveforms for generating a variable-length pulse, in accordance with certain aspects of the present disclosure.

FIG. 5A illustrates an example circuit 500 for generating a variable-length pulse from an analog input, in accordance with certain aspects of the present disclosure. As illustrated, a clock signal 502 may be connected to the gate of two Mosfet P-channle transistors. The resulting signal (e.g., R) may be compared with the analog input 506 to generate the variable-length pulse 508. The variable length pulse may be designed such that length of the pulse is equal to a predetermined constant value (e.g., const) plus a value proportional to the input voltage ($t_{pulse}$=const+a×$V_{input}$).

Figure 5B:
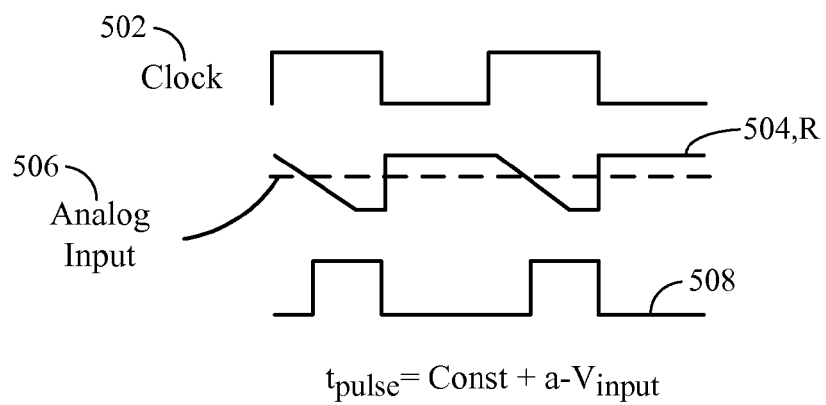

FIG. 5B illustrates example input and output waveforms of the circuit in FIG. 3A, in accordance with certain aspects of the present disclosure. As illustrated, the variable length pulse is generated by comparing the reference signal R 504 to the analog input 506.

Figure 6:
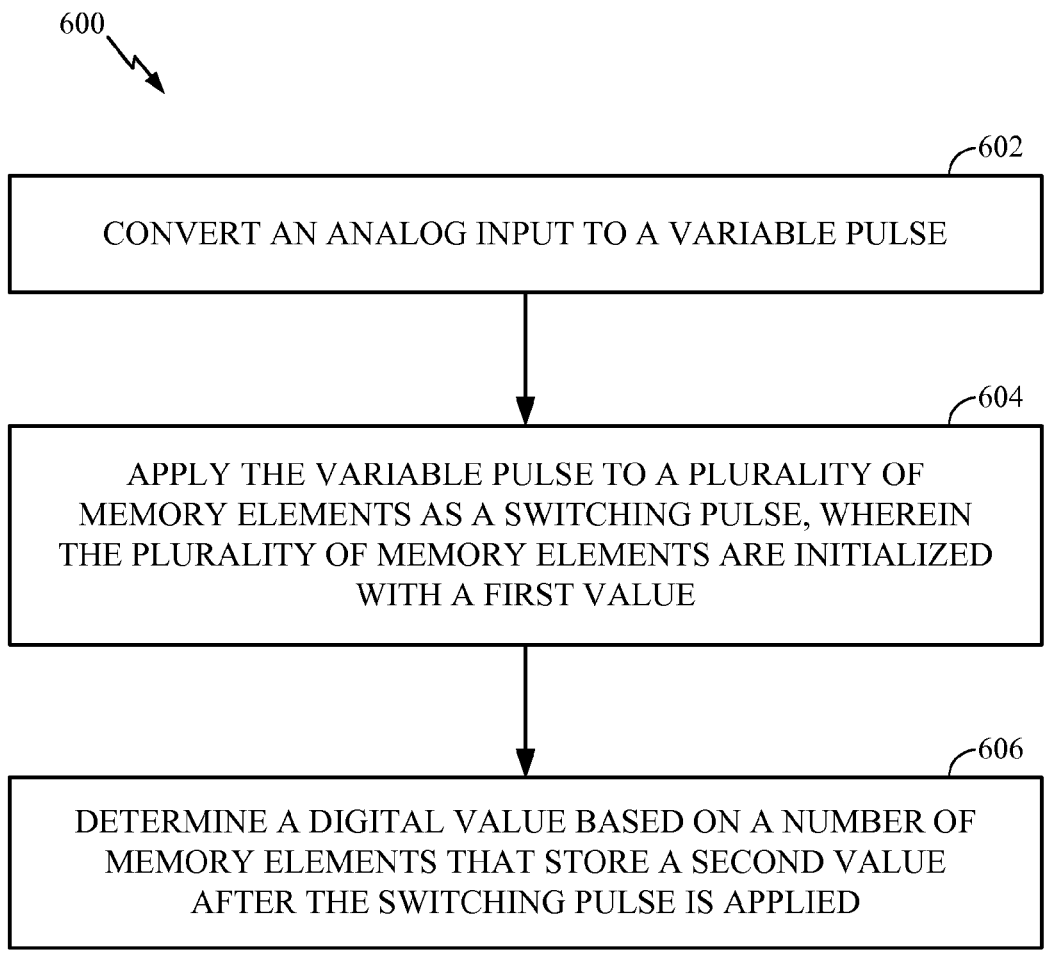
FIG. 6 illustrates example operations that may be performed by a probabilistic ADC, in accordance with certain aspects of the present disclosure.

FIG. 6 illustrates example operations that may be performed by a probabilistic ADC, in accordance with certain aspects of the present disclosure. At 602, the probabilistic ADC may convert an analog input to a variable pulse. For certain aspects, the variable pulse may be a variable-length pulse or a variable-amplitude pulse. At 604, the probabilistic ADC may apply the variable pulse to a plurality of memory elements as a switching pulse, wherein the plurality of memory elements are initialized with a first value (e.g., zero). At 606, the probabilistic ADC may determine a digital value based on a number of memory elements that store a second value (e.g., one) after the switching pulse is applied.

The proposed probabilistic ADC may be suitable for novel applications requiring many hundreds of ADCs on a single chip for sensing applications. It should be noted that size and power consumption of the probabilistic ADC may scale favorably with scaling of digital processes.

The various operations of methods described above may be performed by any suitable means capable of performing the corresponding functions. The means may include various hardware and/or software component(s) and/or module(s), including, but not limited to a circuit, an application specific integrate circuit (ASIC), or processor.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk and Blu-ray® disc where disks usually reproduce data magnetically, while discs reproduce data optically with lasers.

Thus, certain embodiments may comprise a computer program product for performing the operations presented herein. For example, such a computer program product may comprise a computer readable medium having instructions stored (and/or encoded) thereon, the instructions being executable by one or more processors to perform the operations described herein. For certain embodiments, the computer program product may include packaging material.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to embodiments of the present disclosure, other and further embodiments of the disclosure may be devised without departing from the basic scope thereof, and the scope thereof is determined by the claims that follow.

What is claimed is:

1. A method for analog to digital conversion, comprising:
converting an analog input to a variable pulse;
applying the variable pulse to a plurality of memory elements as a switching pulse, wherein the plurality of memory elements are initialized with a first value and are nano-scale memory elements whose switching is a probabilistic function of an applied current or voltage; and
determining a digital value based on a number of memory elements that store a second value after the switching pulse is applied.

2. The method of claim 1, wherein the variable pulse comprises a variable-length pulse or a variable-amplitude pulse.

3. The method of claim 2, wherein length of the variable-length pulse or amplitude of the variable-amplitude pulse is proportional to the analog input value.

4. The method of claim 1, wherein determining the digital value comprises:
reading a plurality of values stored in the memory elements;

determining the number of memory elements that store the second value; and determining the digital value using a mapping function between the number of memory elements that store the second value and a plurality of digital values.

5. The method of claim 1, further comprising:

updating a mapping between number of memory elements that store the second value and the analog input by calibration.

6. A method for analog to digital conversion, comprising:

converting an analog input to a variable pulse;

applying the variable pulse to a plurality of memory elements as a switching pulse, wherein the plurality of memory elements are initialized with a first value; and determining a digital value based on a number of memory elements that store a second value after the switching pulse is applied, wherein switching probability of the plurality of memory elements is a function of pulse width or pulse amplitude of a write pulse.

7. A method for analog to digital conversion, comprising:

converting an analog input to a variable pulse;

applying the variable pulse to a plurality of memory elements as a switching pulse, wherein the plurality of memory elements are initialized with a first value; and determining a digital value based on a number of memory elements that store a second value after the switching pulse is applied, wherein $2^{2n}$ memory elements are used for an n-bit digital value.

8. An apparatus for analog to digital conversion, comprising:

means for converting an analog input to a variable pulse;

means for applying the variable pulse to a plurality of memory elements as a switching pulse, wherein the plurality of memory elements are initialized with a first value and are nano-scale memory elements whose switching is a probabilistic function of an applied current or voltage; and means for determining a digital value based on a number of memory elements that store a second value after the switching pulse is applied.

9. The apparatus of claim 8, wherein the variable pulse comprises a variable-length pulse or a variable-amplitude pulse.

10. The apparatus of claim 9, wherein length of the variable-length pulse or amplitude of the variable-amplitude pulse is proportional to the analog input value.

11. The apparatus of claim 8, wherein means for determining the digital value comprises:

means for reading a plurality of values stored in the memory elements;

means for determining the number of memory elements that store the second value; and means for determining the digital value using a mapping function between the number of memory elements that store the second value and a plurality of digital values.

12. The apparatus of claim 8, further comprising:

means for updating a mapping between number of memory elements that store the second value and the analog input by calibration.

13. An apparatus for analog to digital conversion, comprising:

means for converting an analog input to a variable pulse;

means for applying the variable pulse to a plurality of memory elements as a switching pulse, wherein the plurality of memory elements are initialized with a first value; and means for determining a digital value based on a number of memory elements that store a second value after the switching pulse is applied, wherein switching probability of the plurality of memory elements is a function of pulse width or pulse amplitude of a write pulse.

14. An apparatus for analog to digital conversion, comprising:

means for converting an analog input to a variable pulse;

means for applying the variable pulse to a plurality of memory elements as a switching pulse, wherein the plurality of memory elements are initialized with a first value; and means for determining a digital value based on a number of memory elements that store a second value after the switching pulse is applied, wherein $2^{2n}$ memory elements are used for an n-bit digital value.

15. An apparatus for analog to digital conversion, comprising:

at least one processor configured to convert an analog input to a variable pulse, apply the variable pulse to a plurality of memory elements as a switching pulse, wherein the plurality of memory elements are initialized with a first value and are nano-scale memory elements whose switching is a probabilistic function of an applied current or voltage, and determine a digital value based on a number of memory elements that store a second value after the switching pulse is applied; and a memory coupled with the at least one processor.

16. The apparatus of claim 15, wherein the variable pulse comprises a variable-length pulse or a variable-amplitude pulse.

17. The apparatus of claim 16, wherein length of the variable-length pulse or amplitude of the variable-amplitude pulse is proportional to the analog input value.

18. The apparatus of claim 15, wherein means for determining the digital value comprises:

means for reading a plurality of values stored in the memory elements;

means for determining the number of memory elements that store the second value; and means for determining the digital value using a mapping function between the number of memory elements that store the second value and a plurality of digital values.

19. The apparatus of claim 15, further comprising:

means for updating a mapping between number of memory elements that store the second value and the analog input by calibration.

20. An apparatus for analog to digital conversion, comprising:

at least one processor configured to convert an analog input to a variable pulse, apply the variable pulse to a plurality of memory elements as a switching pulse, wherein the plurality of memory elements are initialized with a first value, and determine a digital value based on a number of memory elements that store a second value after the switching pulse is applied; and a memory coupled with the at least one processor, wherein switching probability of the plurality of memory elements is a function of pulse width or pulse amplitude of a write pulse.

21. An apparatus for analog to digital conversion, comprising:

at least one processor configured to convert an analog input to a variable pulse, apply the variable pulse to a plurality of memory elements as a switching pulse, wherein the plurality of memory elements are initialized with a first value, and determine a digital value based on a number of memory elements that store a second value after the switching pulse is applied; and a memory coupled with the at least one processor, wherein $2^{2n}$ memory elements are used for an n-bit digital value.

22. A computer program product comprising a non-transitory computer-readable medium having instructions stored thereon, the instructions executable by one or more processors for:

converting an analog input to a variable pulse;

applying the variable pulse to a plurality of memory elements as a switching pulse, wherein the plurality of memory elements are initialized with a first value and are nano-scale memory elements whose switching is a probabilistic function of an applied current or voltage; and determining a digital value based on a number of memory elements that store a second value after the switching pulse is applied.

23. A computer program product comprising a non-transitory computer-readable medium having instructions stored thereon, the instructions executable by one or more processors for:

converting an analog input to a variable pulse;

applying the variable pulse to a plurality of memory elements as a switching pulse, wherein the plurality of memory elements are initialized with a first value; and determining a digital value based on a number of memory elements that store a second value after the switching pulse is applied, wherein switching probability of the plurality of memory elements is a function of pulse width or pulse amplitude of a write pulse.

24. A computer program product comprising a non-transitory computer-readable medium having instructions stored thereon, the instructions executable by one or more processors for:

converting an analog input to a variable pulse;

applying the variable pulse to a plurality of memory elements as a switching pulse, wherein the plurality of memory elements are initialized with a first value; and determining a digital value based on a number of memory elements that store a second value after the switching pulse is applied, wherein $2^{2n}$ memory elements are used for an n-bit digital value.

* * * * *